(12) United States Patent
Ikeda et al.

(10) Patent No.: US 7,829,910 B2
(45) Date of Patent: Nov. 9, 2010

(54) LIGHT EMITTING DEVICE AND METHOD OF FABRICATING LIGHT EMITTING DEVICE

(75) Inventors: Hitoshi Ikeda, Annaka (JP); Masayoshi Obara, Tokyo (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 312 days.

(21) Appl. No.: 11/883,078

(22) PCT Filed: Jan. 26, 2006

(86) PCT No.: PCT/JP2006/301250

§ 371 (c)(1),
(2), (4) Date: Jul. 26, 2007

(87) PCT Pub. No.: WO2006/380408

PCT Pub. Date: Aug. 3, 2006

(65) Prior Publication Data

US 2008/0164488 A1    Jul. 10, 2008

(30) Foreign Application Priority Data

Jan. 31, 2005    (JP)    ............................. 2005-023988

(51) Int. Cl.
H01L 29/43    (2006.01)
(52) U.S. Cl. .................. 257/99; 257/751; 257/772; 257/E33.063; 257/E23.028
(58) Field of Classification Search .......... 257/E33.063, 257/99, 751, 772, E23.028
See application file for complete search history.

(56) References Cited

U.S. PATENT DOCUMENTS 6,771,676 B2    8/2004    Takeuchi et al.

(Continued)

FOREIGN PATENT DOCUMENTS

JP    2-260671    10/1990

(Continued)

OTHER PUBLICATIONS

Takao, Hisaaki, et al., "Development of Highly Reliable Sn-Ag Lead-Free Solder Alloy," The R & D Review, Jun. 2000, pp. 39-46, vol. 35, No. 2, Toyota Central Research Labs, Inc.

Primary Examiner—Thanh V Pham
Assistant Examiner—Maria Ligai
(74) Attorney, Agent, or Firm—Oliff & Berridge, PLC

(57) ABSTRACT

Each second electrode formed on a second main surface of a compound semiconductor layer of a light emitting device has an alloyed contact layer disposed contacting the second main surface, aimed at reducing contact resistance with the compound semiconductor layer, and a solder layer connecting the alloyed contact layer to the conductive support. The solder layer forms therein a Sn-base solder layer disposed on the alloyed contact layer side having a melting point lower than the alloyed contact layer, and a Au—Sn-base solder layer disposed contacting the Sn-base solder layer opposed to the alloyed contact layer side, containing total Au and Sn of 80% or more, and having a melting point higher than the Sn-base solder layer. This configuration can provide excellent reliability of bonding between the Au—Sn-base solder layer and the alloyed contact layer, and consequently less causative of delamination of the Au—Sn-base solder layer.

13 Claims, 13 Drawing Sheets

U.S. PATENT DOCUMENTS

| | | | |
|---|---|---|---|
| 2002/0000558 A1* | 1/2002 | Morimoto | 257/79 |
| 2002/0028527 A1* | 3/2002 | Maeda et al. | 438/29 |
| 2002/0140059 A1* | 10/2002 | Yamazaki et al. | 257/658 |
| 2003/0022410 A1* | 1/2003 | Yokouchi et al. | 438/39 |
| 2003/0048818 A1 | 3/2003 | Takeuchi et al. | |
| 2003/0186476 A1* | 10/2003 | Naydenkov et al. | 438/26 |

FOREIGN PATENT DOCUMENTS

| | | | |
|---|---|---|---|
| JP | A-7-94786 | | 4/1995 |
| JP | 9-27498 | | 1/1997 |
| JP | 11000791 | * | 1/1999 |
| JP | A-2001-057468 | | 2/2001 |
| JP | 2002-151629 | * | 5/2002 |
| JP | A-2003-86877 | | 3/2003 |
| JP | 2003-142731 | | 5/2003 |

* cited by examiner

LIGHT EMITTING DEVICE AND METHOD OF FABRICATING LIGHT EMITTING DEVICE

RELATED APPLICATIONS

This application claims the priority of Japanese Patent Application No. 2005-023988 filed on Jan. 31, 2005, which is incorporated herein by reference.

BACKGROUND OF THE INVENTION

1. Field of the Invention

This invention relates to a light emitting device and a method of fabricating the light emitting device.

2. Description of the Related Art

[Patent Document 1] Japanese Laid-Open Patent Publication No. H2-260671

[Patent Document 2] Japanese Laid-Open Patent Publication No. H9-27498

[Patent Document 3] Japanese Laid-Open Patent Publication No. 2003-142731

[Non-Patent Document 1] "Development of Highly Reliable Sn—Ag Lead-Free Solder Alloy", The R&D Review, Toyota Central Research Labs., Inc., Vol. 35, No. 2 (2000), p. 39"

Light emitting devices composed of compound semiconductors have long been configured, while assuming the main surface thereof positioned on the light extraction side as a first main surface, and the main surface thereof opposite thereto as a second main surface, so that electrodes on the second main surface side, which corresponds to the back surface of a device chip, are bonded to a metal stage using Ag paste (Patent Document 1), but there has been an ongoing discussion on shifting into mounting process based on solder reflow, similar to a so-called flip chip method, in view of improving process efficiency in chip mounting (Patent Document 2). "Solder" generally referred to in mounting process of electronic devices means Pb—Sn-base solder, and in particular, an eutectic solder composed of a low-melting-point Pb-38%-by-mass-Sn alloy (mp. 183° C.) has widely been used. However, recent increasing demands are directed to use of low-Pb solder containing no Pb (or containing only a smaller content of Pb than in the eutectic solder), in place of conventional Sn—Pb eutectic solder, in view of environmental pollution.

As the low-Pb solder substitutive to the conventional Pb-base solder, solders mainly containing Sn have been considered (Non-Patent Document 1), but they have not so extensively been considered on applications thereof to mounting of light emitting device chips, because of concern of oxidation of the solders mainly composed of Sn. More specifically, Au—Sn-base solder has been proposed as a solder suitable for mounting light emitting device chips, by virtue of its excellence also in corrosion resistance (Patent Document 3).

In the structure of mounting described in Patent Document 3, a Au-base alloyed contact layer (alloyed layer) for ensuring ohmic contact is formed on the second main surface side of a light emitting device chip, a Mo layer is disposed so as to prevent diffusion to or from the alloyed contact layer, a AuGe alloyed layer is further disposed as a metal film having the melting point higher than that of the Au—Sn-base solder, and on the AuGe alloyed layer, there is disposed a structure having a Au—Sn-base solder layer to be reflowed formed thereon. According to the description in Patent Document 3, the Mo layer was conventionally covered with an Au layer, and the Au—Sn-base solder layer was formed on the Au layer, but the Au layer is consumed by the Au—Sn-base solder layer during the reflow process, bringing the Au—Sn-base solder layer into direct contact with the Mo layer, lowering the adhesiveness, and thereby making the Au—Sn-base solder layer more likely to cause delamination from the Mo layer. Therefore, a countermeasure is such as disposing, in place of the Au layer, an AuGe alloyed layer having a higher melting point (that is, not fused during the reflow process) than that of the Au—Sn-base solder, so as to avoid direct contact between the Au—Sn-base solder layer and the Mo layer, and to thereby improve the adhesiveness.

Investigations by the present inventors have, however, revealed that the problem of delamination of the Au—Sn-base solder layer cannot readily be solved, even if the configuration described in Patent Document 3 is adopted. Patent Document 3 exemplifies poor adhesion between the Au—Sn-base solder layer and the Mo layer as a causal factor of the delamination, however in practice, it is supposed that, due to hardness and poor ductility of the Au—Sn-base solder layer per se, and also due to relatively poor ductility of the AuGe alloy as an object to be adhered to, the materials cannot absorb stress induced by impact or thermal hysteresis by their plastic deformation, and result in delamination.

It is therefore an object of this invention to provide, in conjunction with the light emitting device on the premise of mounting by aid of the Au—Sn-base solder layer, a device structure (and a light emitting device module using the same) excellent in reliability of bonding between the Au—Sn-base solder layer and the alloyed contact layer, and less causative, for example, of delamination of the Au—Sn-base solder layer, and a method of fabricating the same.

SUMMARY OF THE INVENTION

A light emitting device of this invention aimed at solving the above-described object has a compound semiconductor layer having therein a light emitting layer section, the compound semiconductor layer being assumed that the main surface thereof positioned on the light extraction side is referred to as a first main surface, and that the main surface thereof opposite thereto as a second main surface, having a first electrode formed on the first main surface of the compound semiconductor layer, and second electrodes formed on the second main surface, so as to be used as being electrically connected through the second electrodes to a conductive support for the device to be fixed to, wherein each of the second electrodes comprises an alloyed contact layer disposed in contact with the second main surface of the compound semiconductor layer, aimed at reducing contact resistance with the compound semiconductor layer, and a solder layer connecting the alloyed contact layer to the conductive support (for example, a metal frame or the like), the solder layer having formed therein a Sn-base solder layer disposed on the alloyed contact layer side and composed of a Sn-base metal mainly containing Sn and having a melting point lower than that of the alloyed contact layer, and a Au—Sn-base solder layer disposed in contact with the Sn-base solder layer on the opposite side of the alloyed contact layer, containing 30% by mass or more and 90% by mass or less of Au, and 10% by mass or more and 70% by mass or less of Sn, the total content of Au and Sn being 80% by mass or more. It is to be noted herein that the expression "mainly containing Sn" in the Sn-base solder means that the Sn content is 50% by mass or more.

In the light emitting device of this invention described above, as a solder material used for mounting the second electrodes disposed on the mounting side of the compound semiconductor layer, the Au—Sn-base solder layer, mainly containing Au, and having the Sn content adjusted so as to achieve the melting point higher than that of the Sn-base solder layer but not higher than 500° C., is adopted. An essential feature of this invention resides in that the Sn-base solder layer, composed of the Sn-base metal mainly containing Sn and having the melting point lower than that of the alloyed contact layer, is disposed in between, rather than bringing the Au—Sn-base solder layer into direct contact with the alloyed contact layer (generally hard, such as Au—Ge alloy, Au—Be alloy and so forth described later) for lowering contact resistance in the second electrodes. The solder layer mainly containing Sn is not only excellent in adhesiveness with the Au—Sn-base solder layer, but also far softer as compared with the Au—Sn-base solder layer, allowing itself to function as a so-called buffer layer absorbing and moderating, by plastic deformation, any applied stress due to impact or thermal hysteresis. As a consequence, delamination of the Au—Sn-base solder layer and so forth can largely be suppressed.

A light emitting device module of this invention is characterized by having the above-described light emitting device of this invention, a conductive support on which the compound semiconductor layer of the light emitting device is bonded through the solder layer of the second electrodes, and an epoxy resin mold covering the light emitting device on the conductive support. The epoxy resin mold is formed by covering the light emitting device using uncured epoxy resin, and then allowing it to cure. The epoxy resin has a relatively large refractive index, and can suppress difference of refractive index from that of a compound semiconductor (more specifically, III-V compound semiconductor or II-VI compound semiconductor) composing the light emitting device to a small level, so that it is less likely to cause total reflection on the mold interface, and can thus contribute to improvement in light extraction efficiency. The epoxy resin is, however, likely to produce acidic released compounds during curing by polymerization, so that the Sn-base solder, particularly when composing the solder layer solely by itself, is susceptible to degradation due to corrosive attack by the acidic released compounds. In contrast in this invention, a main bonding portion of the solder layer with the conductive support is composed of the Au—Sn-base solder layer, and can therefore make the solder layer less causative of degradation due to the corrosive attack.

Next, the method of fabricating a light emitting device of this invention is a method of fabricating the above-described light emitting device of this invention, and is characterized by carrying out, in this order, a source metal layer forming step of forming a source metal layer of the alloyed contact layer on the second main surface of the compound semiconductor layer;

an alloy annealing step of alloying the source metal layer with the compound semiconductor layer to produce the alloyed contact layer;

a Sn-base solder layer forming step of forming the Sn-base solder layer on the alloyed contact layer;

a Au—Sn-base solder layer forming step of forming the Au—Sn-base solder layer on the Sn-base solder layer; and a Sn-base solder layer fusing annealing step of heating the electrode stack structure having the alloyed contact layer, the Sn-base solder layer and the Au—Sn-base solder layer stacked therein in this order, at a temperature not lower than the melting point of the Sn-base solder layer, and lower than the melting points of the alloyed contact layer and the Au—Sn-base solder layer, so as to selectively fuse the Sn-base solder layer.

According to the method described in the above, the alloyed contact layer having a relatively high melting point is preliminarily formed, and thereafter the Sn-base solder layer and the Au—Sn-base solder layer are formed. Because the Sn-base solder layer has a lower melting point as compared with both of the alloyed contact layer and the Au—Sn-base solder layer, annealing for selectively fusing the Sn-base solder layer is feasible, and the Sn-base solder layer and the Au—Sn-base solder layer can be tightly adhered, after allowing the Sn-base solder layer to fuse and re-solidify. The Sn-base solder layer and the Au—Sn-base solder layer differ, of course, in the Au and Sn contents from each other, so that both components can diffuse between the layers during the fusing annealing, and the fact again contributes to the adhesion strength.

The Sn content of the Sn-base solder layer is preferably adjusted to 75% by mass or more (including 100% by mass). The Sn content less than 75% by mass results in ductility decrease of the Sn-base solder layer, and thereby the effect of preventing delamination of the Au—Sn-base solder layer becomes insufficient. The residual components excluding the Sn component in the Sn-base solder layer will consequently be occupied by Au in the major portion thereof, considering that the layer goes through the fusing annealing process while being kept in contact with the Au—Sn-base solder layer (more specifically, 80% by mass or more of the residual portion of the Sn-base solder layer excluding the Sn component accounts for Au). In this case, the Sn content in the Sn-base solder layer less than 75% by mass results in increase in the content of Au as the residual component, increase in the amount of production of Au—Sn-base compounds ($AuSn_4$, $AuSn_2$ and $AuSn$) having poor ductility, and particularly large tendency of degrading ductility of the Sn-base solder layer.

On the other hand, the Au—Sn-base solder layer is adjusted in the composition thereof, so as to contain 30% by mass or more and 90% by mass or less of Au, and 10% by mass or more and 70% by mass or less of Sn, so as to also have a total content of Au and Sn of 80% by mass or more, and so as to have the melting point higher than that of the Sn-base solder layer. The Au content of less than 30% by mass (or the Sn content exceeding 70% by mass) will make corrosion resistance of the solder layer insufficient, and the Au content exceeding 90% by mass (or the Sn content less than 10% by mass) will make the melting point of the solder layer excessively high, and the reflow temperature for mounting the device chip becomes excessively high. For the purpose of lowering the melting point of the solder, other by-components (Zn, Ge, Bi, Te, Si and Sb, for example) may be added up to an amount of 20% by mass of the total solder composition. The total content of Au and Sn is, therefore, adjusted to 80% by mass or more (100% by mass or less).

In view of improving the corrosion resistance of the solder layer as a whole, it is preferable to form the Au—Sn-base solder layer to a thickness larger than that of the Sn-base solder layer poorer in corrosion resistance. In particular, for the case where the light emitting device chip is covered with the epoxy resin mold as described in the above, adoption of this configuration raises a distinctive effect.

Next, the compound semiconductor layer may be configured so that the second electrodes are formed as being distributed on the second main surface side of the light emitting layer section. The region of the alloyed contact layer of the second electrode is low in reflectivity, and has only a small effect of reflecting the direct flux of beam from the light emitting layer section towards the first main surface side (or chip flank side). However, by forming the second electrodes in a distributed manner, the region of the compound semiconductor layer, having no second electrodes formed thereon on the second main surface side, can be used as a reflective region, so that an effect of improving the light extraction efficiency by allowing the direct flux of beam to reflect towards the first main surface side can be expected. This effect becomes distinctive particularly for the case where a transparent compound semiconductor layer composed of a compound semiconductor transparent to the flux of beam emitted from the light emitting layer section is provided, and the second electrodes are formed as being distributed on the second main surface of the transparent compound semiconductor layer. For the case where the light emitting layer section is composed of an AlGaInP light emitting layer section, the transparent compound semiconductor layer can be configured typically by using a GaP layer.

In this case, it is preferable that the second electrodes are formed on the second main surface of the compound semiconductor layer, as being distributed after being patterned into a predetermined geometry, and that the solder layer in each of the second electrodes is formed so as to align position of the circumferential side faces thereof with those of the alloyed contact layer. According to this configuration, the area of the fused solder layer possibly swelling out of the alloyed contact layer during the reflow process can be minimized, and thereby larger area available as the reflective surface can be ensured between every adjacent second electrodes. By adopting the method of fabrication of this invention, a structure of this sort of second electrodes can be obtained in an extremely easy manner as described below.

That is, the alloyed contact layer is formed as being distributed on the second main surface of the compound semiconductor layer, and the Sn-base solder layer is formed so as to cover the alloyed contact layer and the exposed area of the compound semiconductor layer as background in an integrated manner. The Au—Sn-base solder layer is further formed, the Sn-base solder layer fusing annealing step is carried out, and thereafter the lift-off process is carried out so as to remove the stacked film of the Sn-base solder layer and the Au—Sn-base solder layer, selectively in the portion thereof covering the background of the alloyed contact layer, while leaving the portion thereof covering the alloyed contact layer as being closely adhered to the alloyed contact layer. In the Sn-base solder layer fusing annealing step, the adhesive force of the Sn-base solder layer with the compound semiconductor layer, specifically in the portion thereof in direct contact with the exposed region of the compound semiconductor layer, is far smaller than the adhesive force thereof with an underlying metal, specifically in the portion having the alloyed contact layer formed therein, so that the portion covering the background of the alloyed contact layer can extremely readily be lifted off, typically by adhering and peeling of an adhesive sheet. Structure of the resultant solder layer is such as having the circumferential side faces thereof formed as mechanically fractured surfaces extending in the thickness-wise direction as being originated from the outer circumference of the bonding interface with the alloyed contact layer.

BEST MODES FOR CARRYING OUT THE INVENTION

Figure 1:
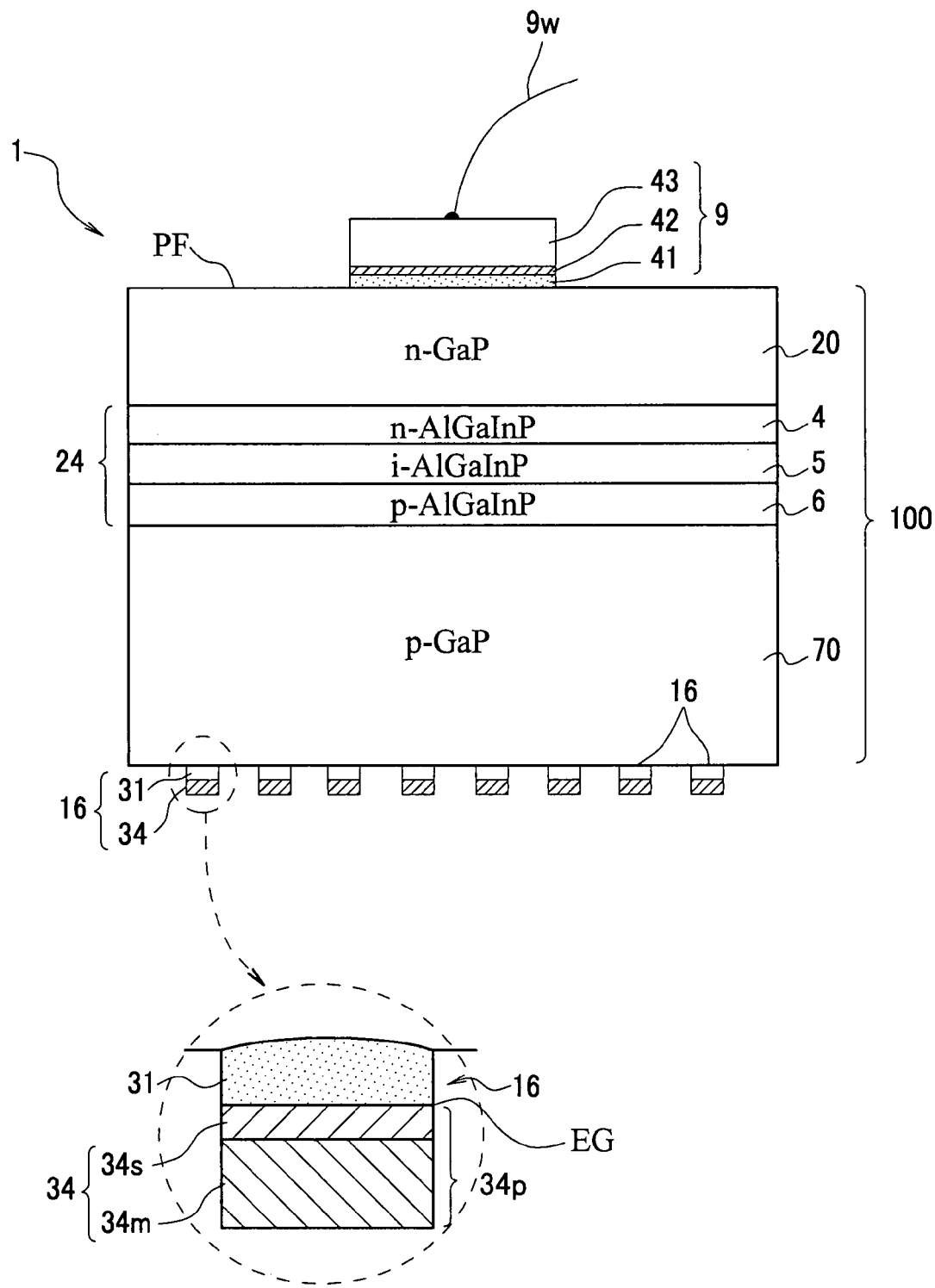
FIG. 1 is a schematic sectional view showing an example of the light emitting device to be applied with this invention.

Embodiments of the method of fabricating the light emitting device of this invention will be explained below, referring to the attached drawings. FIG. 1 is a schematic view showing light emitting device to be applied with this invention. The light emitting device 1 has a compound semiconductor layer 100 having therein a light emitting layer section 24, and while assuming the main surface of the compound semiconductor layer 100 positioned on the light extraction side as a first main surface, and the main surface opposite thereto as a second main surface, has a first electrode 9 formed on the first main surface, and has second electrodes 16 formed on the second main surface, respectively. Each of the second electrodes 16 has an alloyed contact layer 31 disposed in contact with the second main surface of the compound semiconductor layer 100, aimed at reducing contact resistance with the compound semiconductor layer 100, and a solder layer 34 connecting the alloyed contact layer 31 to the conductive support 52 (see FIG. 2), wherein the solder layer 34 has, as being formed therein, a Sn-base solder layer 34s disposed on the alloyed contact layer 31 side and composed of a Sn-base metal mainly containing Sn and having a melting point lower than that of the alloyed contact layer 31, and a Au—Sn-base solder layer 34m disposed in contact with the Sn-base solder layer 34s on the opposite side of the alloyed contact layer 31, containing 30% by mass or more and 90% by mass or less of Au, and 10% by mass or more and 70% by mass or less of Sn, the total content of Au and Sn being 80% by mass or more, and having a melting point higher than that of the Sn-base solder layer 34s.

The light emitting device 1 of this embodiment is configured so that a light emitting layer section 24 contains a p-type cladding layer 6 composed of p-type AlGaInP, an n-type cladding layer 4 composed of n-type AlGaInP, and an active layer 5 composed of non-dope AlGaInP held therebetween, and as being adjustable in the emission wavelength over the region from green to red (emission wavelength (peak emission wavelength) of 550 nm to 670 nm, both ends inclusive), depending on the composition of the active layer 5. In this embodiment, the first main surface side (first electrode 9 side) of the compound semiconductor layer 100 has an n-type conductivity, and the second main surface side (second electrode 16 side) has a p-type conductivity. The alloyed contact layer 31 composing the second electrodes 16 is a Au—Be alloy (for example having a composition of Au-1% by mass Be) in this embodiment. On the other hand, for the case where the second main surface side of the compound semiconductor layer 100 has an n-type conductivity, the alloyed contact layer 31 is configured using AuSi alloy or AuGeNi alloy.

The light emitting layer section 24 has a current spreading layer 20 composed of n-type GaP, as being formed on the first main surface thereof, and has a transparent compound semiconductor layer 70 composed of p-type GaP, as being formed on the second main surface thereof. The first electrode 9 is formed at the near center of the first main surface of the current spreading layer 20, and has an alloyed contact layer 41 composed of AuSi alloy (or AuGeNi alloy), as being disposed on the GaP current spreading layer 20 so as to ensure ohmic contact therewith, and a main electrode 43 composed of Au disposed thereon. Between the main electrode 43 and the alloyed contact layer 41, there is disposed a barrier metal layer 42 (typically composed of a metal having any one of Ti, Ni or Mo as a major component (50% by mass or more), wherein Ti is used in this embodiment) preventing diffusion of Si and so forth towards the main electrode 43 side. The area around the light extraction surface side electrode 9 on the first main surface of the current spreading layer 20, forms a light extraction field PF allowing therethrough extraction of light from the light emitting layer section 24. The form of stacking adopted in this embodiment is such as having the n-type cladding layer 4 on the light extraction surface side, whereas the p-type cladding layer 6 may be disposed on the light extraction surface side (in this case, the current spreading layer 20 must have p-type conductivity, and the alloyed contact layer 41 is composed of AuBe alloy or the like).

Figure 2:
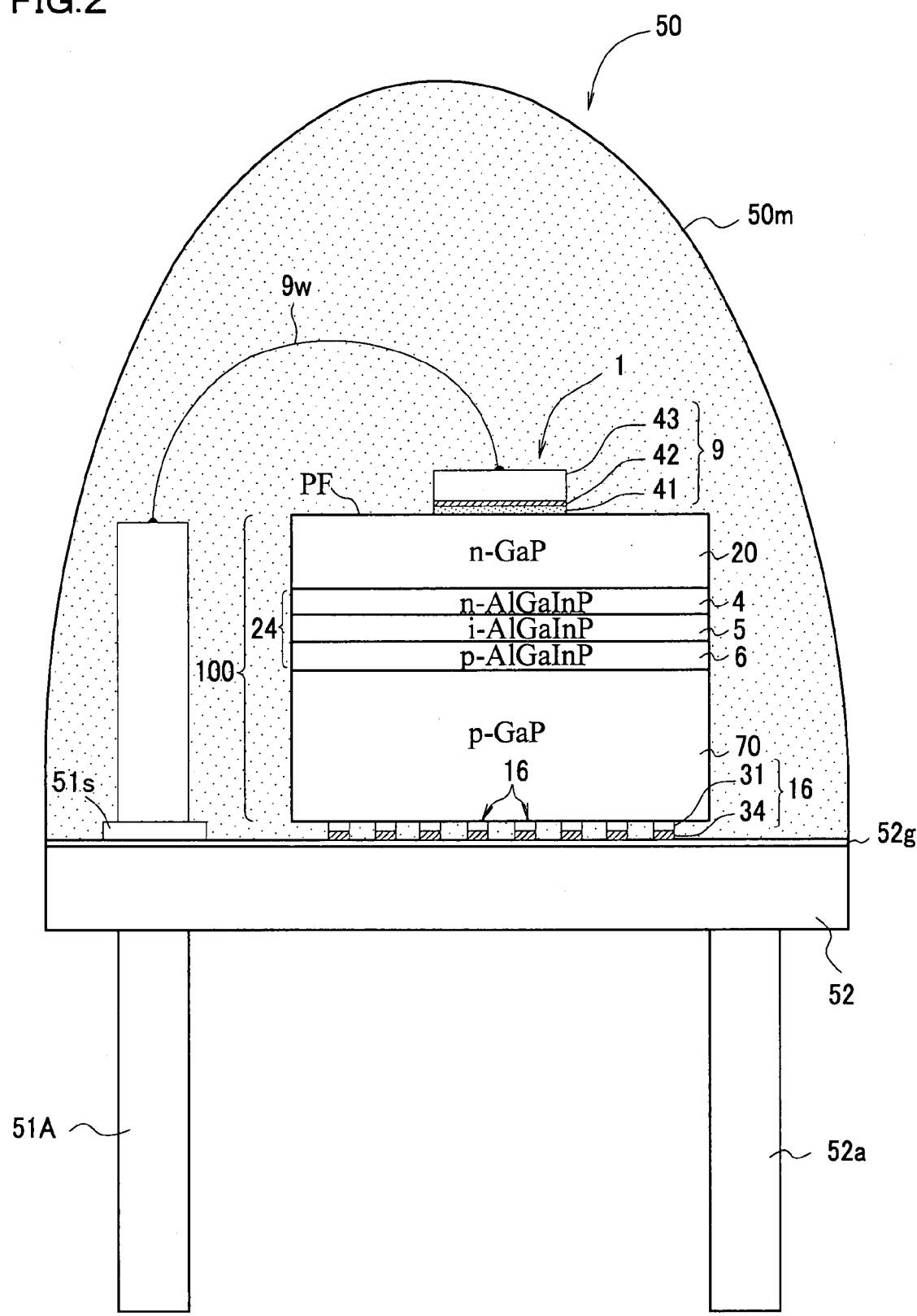
FIG. 2 is a schematic sectional view showing an example of the light emitting device module of this invention using the light emitting device shown in FIG.

FIG. 2 shows an example of a light emitting device module using the above-described light emitting device 1. The light emitting device module 50 is configured as having the above-described light emitting device 1, a conductive support 52 on which the compound semiconductor layer 100 of the light emitting device 1 is bonded through the solder layer of the second electrodes 16, and an epoxy resin mold 50m covering the light emitting device 1 on the conductive support 52. The conductive support 52 is configured as a plate-form metal stage, having a first main surface thereof covered with a reflective metal layer 52g typically composed of Ag or the like, and the light emitting device 1 is mounted thereon as being bonded through the solder layer 34 of the second electrodes 16. On the other hand, the first electrode 9 of the light emitting device 1 is electrically connected to a conductor metal fitting 51A thorough a bonding wire 9w typically composed of Au wire. The conductor metal fitting 51A penetrates a metal stage 52 and extends out into the back surface side. On the other hand, a supply terminal 52a is formed on the back surface side of the metal stage 52, as being projected out therefrom. Between the conductor metal fitting 51A and the metal stage 52, an insulating ring 51s is disposed. The light emitting layer section 24 is applied with operation voltage for light emission through the conductor metal fitting 51A and the supply terminal 52a. On the metal stage 52, the light emitting device 1 is covered with the above-described epoxy resin mold portion 50m. Although the epoxy resin is likely to produce acidic released compounds during curing by polymerization, the solder layer 34 is less susceptible to degradation even if challenged by corrosive attack of the acidic released compounds, because the essential portion thereof is configured by the Au—Sn-base solder layer 34m (see FIG. 1).

Mounting of the light emitting device 1 on the conductive support 52 will follow the procedures below. That is, the light emitting device 1 is placed on the conductive support 52 while directing the second main surface side thereof downward. The work is then inserted into a reflow furnace while maintaining that state, and heated to a predetermined reflow temperature, so as to fuse the solder layer 34 of the second electrodes 16. The succeeding cooling allows the second electrodes 16 to be soldered to the conductive support 52. As shown in FIG. 1, the second electrodes 16 use, as a solder material for mounting, the Au—Sn-base solder layer 34m mainly containing Au, and having the Sn content adjusted so as to achieve the melting point higher than that of the Sn-base solder layer 34s but not higher than 500° C. In each of the second electrodes 16, the Au—Sn-base solder layer 34m is not brought into direct contact with the alloyed contact layer 31 for reducing contact resistance, and instead the Sn-base solder layer 34s composed of Sn-base metal, mainly composed of Sn, and having the melting point lower than that of the alloyed contact layer 31 is disposed therebetween. The Sn-base solder layer 34s shows good adhesiveness to the Au—Sn-base solder layer 34m. The Sn-base solder layer 34s is far softer as compared with the Au—Sn-base solder layer 34m, allowing itself to function as a so-called buffer layer absorbing and moderating, by plastic deformation, any applied stress due to impact or thermal hysteresis. As a consequence, delamination of the Au—Sn-base solder layer 34m and so forth can largely be suppressed.

Paragraphs below will explain a specific example of the method of fabricating the above-described light emitting device 1.

Figure 3:
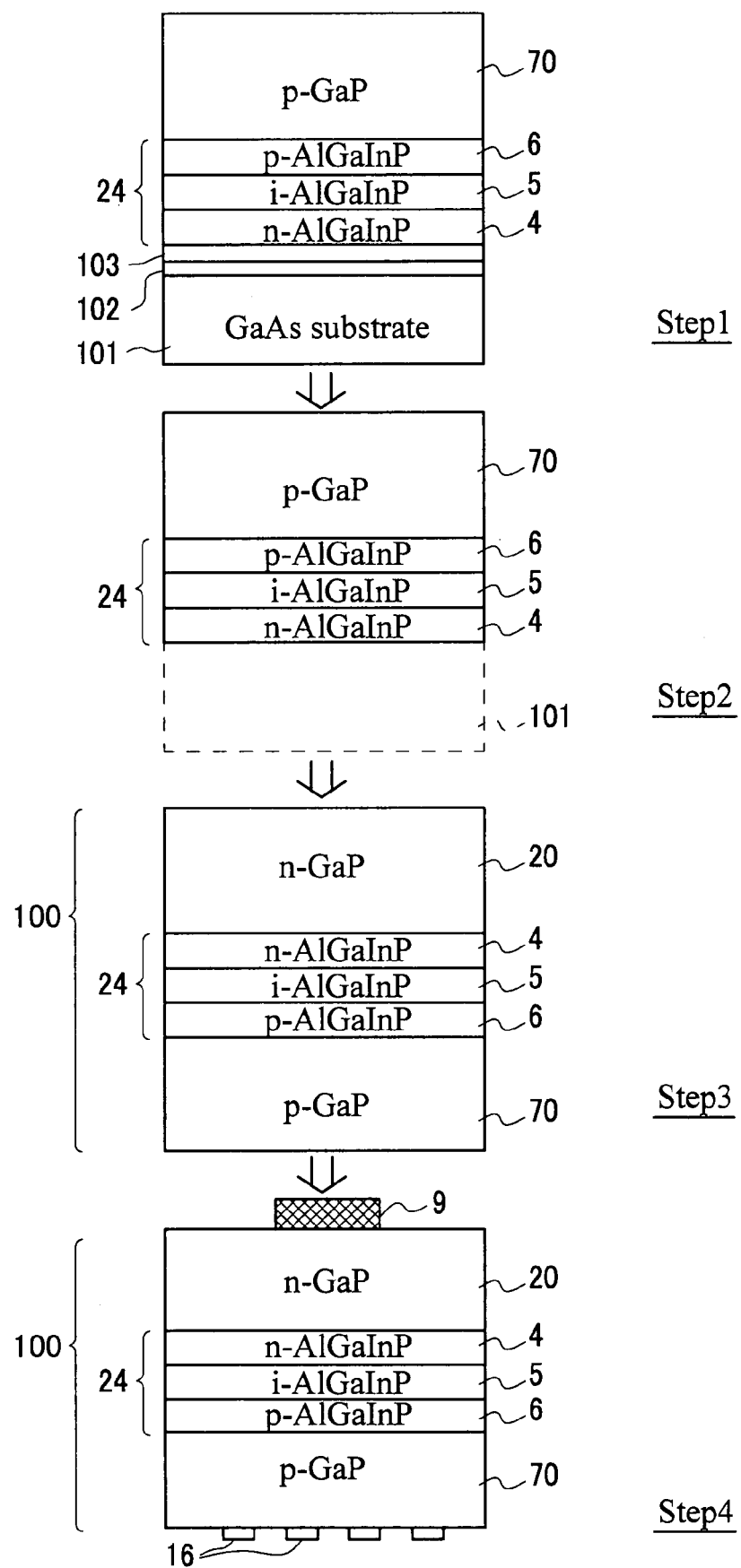
FIG. 3 is a first explanatory drawing showing an example of process steps of fabricating the light emitting device of this invention.

First, as shown in step 1 in FIG. 3, an n-type GaAs buffer layer 102 and a separation layer 103 composed of AlAs are epitaxially grown in this order on the main surface of a GaAs single crystal substrate 101. Thereafter, as the light emitting layer section 24, the n-type cladding layer 4, the active layer 5 and the p-type cladding layer 6 are epitaxially grown in this order. The transparent compound semiconductor layer 70 composed of p-type GaP is further epitaxially grown. The epitaxial growth of the individual layers described in the above can be proceeded by publicly known MOVPE method (also the hydride vapor phase growth process is adoptable for the transparent compound semiconductor layer 70).

Next, as shown in step 2, the GaAs single crystal substrate 101 is removed. The removal can be carried out by selectively etching the AlAs separation layer 103 formed between the buffer layer 102 and the light emitting layer section 24, using an appropriate etching solution (a 10% aqueous hydrofluoric acid solution, for example), so as to separate the GaAs single crystal substrate 101. It is also allowable herein to preliminarily form an etch stop layer composed of AlInP, in place of the AlAs separation layer 103, and to etch off the entire portion of the GaAs single-crystal substrate 101, using an etching solution having selective etching property to GaAs (for example, ammonia/hydrogen peroxide mixed solution). It is still also allowable to remove a part of the GaAs single crystal substrate 101 by mechanical polishing before the etching process.

The grown layers of compound semiconductors, from which the GaAs single crystal substrate 101 was thus removed, is then placed upside-down, and as shown in step 3, and the current spreading layer 20 composed of n-type GaP is epitaxially grown by a publicly known vapor phase growth process such as the hydride vapor phase growth process or the MOVPE method or the like, on the second main surface of the light emitting layer section 24. The process steps of fabricating the compound semiconductor layer 100 now come to the end. It is to be noted that at least one, or both of the current spreading layer 20 and the transparent compound semiconductor layer 70 may be formed by bonding a GaP substrate obtained from elsewhere.

Thereafter, as shown in step 4, the first electrode 9 is formed on the first main surface of the compound semiconductor layer 100, and the second electrodes 16 are formed on the second main surface of the same. Although the drawing shows only a stacked form of a single device for convenience of understanding of the explanation, an actual process is such as manufacturing a wafer having a plurality of device chips formed at the same time as being arranged in a matrix. The wafer is diced by a general method so as to produce the device chips, and each device chip is then bonded to the support, wire-bonded through lead wires, and molded with the resin, to thereby obtain a final form of the light emitting device.

Because steps of fabrication proceeded-on the first electrode 9 side are publicly known, paragraphs below will further explain detail steps of fabricating the second electrodes 16, constructing an essential portion of this invention. First, as shown in step 5 in FIG. 4, a source metal layer 31' of the alloyed contact layer 31 is formed on the second main surface of the compound semiconductor layer 100 (source metal layer forming step). In this embodiment, the source metal layer 31' is configured by a main layer 31b composed of Au—Be alloy, and Au layers 31a holding it in between. Next, as shown in step 6, alloying annealing is carried out so as to alloy the source metal layer 31' with the compound semiconductor layer 100 to thereby produce the alloyed contact layer 31 (alloying annealing step). By this process, the source metal layers 31b, 31a are converted into the alloyed contact layer 31. The alloying annealing can be carried out typically at a temperature of 350° C. or above and 600° C. or below.

Then as shown in step 7, a Sn-base solder layer 34s' (as for constituents of the solder layer, those indicated by (') express that the constituents are in the state before the fusing annealing, and those without (') express that the constituents are in the state after the fusing annealing) is formed on the alloyed contact layer 31 (Sn-base solder layer forming step). On the Sn-base solder layer 34s', a Au—Sn-base solder layer 34m' is further formed (Au—Sn-base solder layer forming step). Formation of these metal layers can be carried out by vapor phase film growth process such as vacuum evaporation, sputtering or the like, and still can be carried out by adopting chemical plating process.

Figure 5:
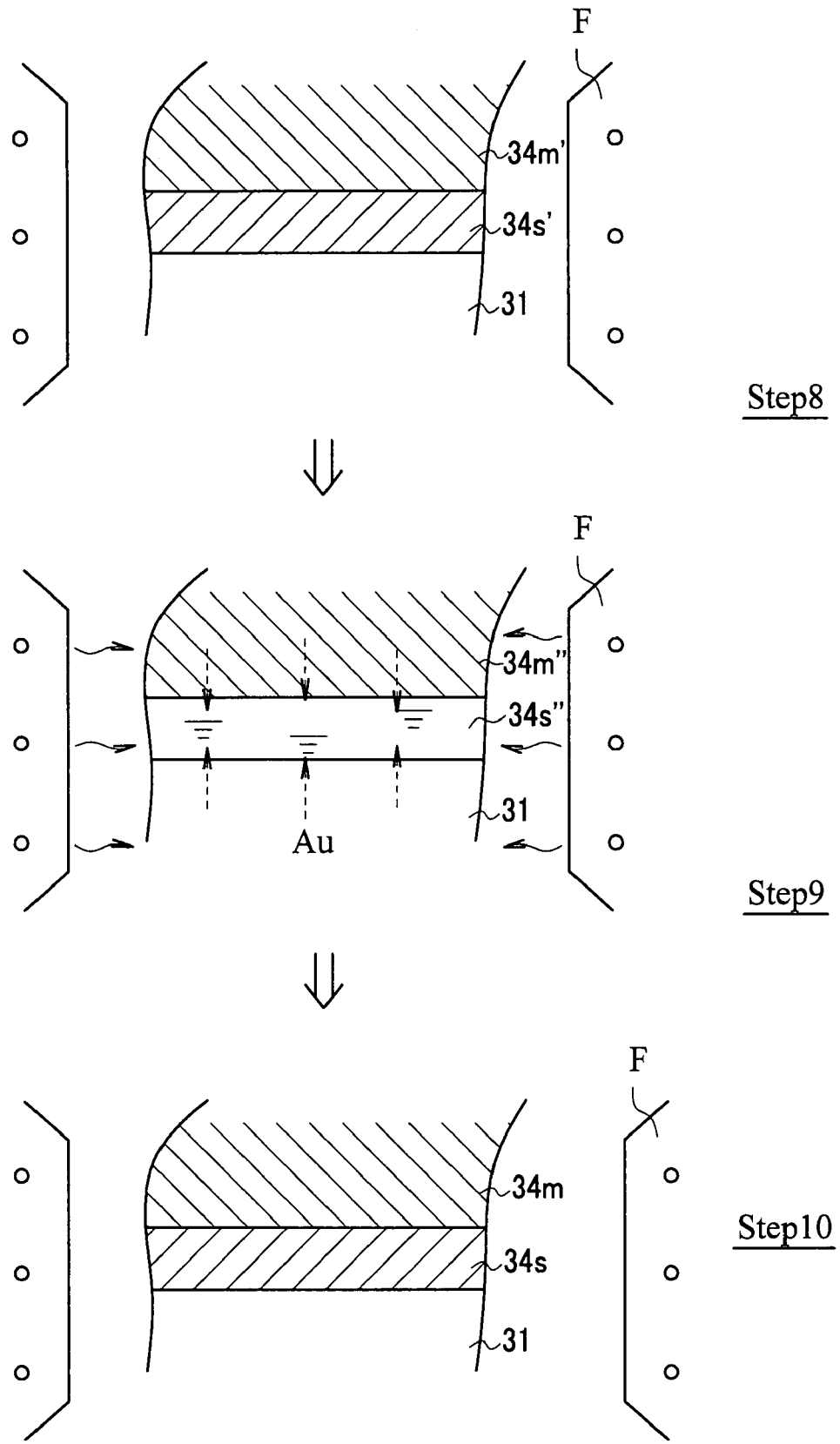
FIG. 5 is a third explanatory drawing of the same.

Next, as shown in steps 8 to 9 in FIG. 5, the stacked electrode structure having the alloyed contact layer 31, the Sn-base solder layer 34s' and the Au—Sn-base solder layer 34m' stacked therein in this order, as described above is then annealed at a temperature not lower than the melting point of the Sn-base solder layer 34s' and lower than the melting points of the alloyed contact layer 31 and the Au—Sn-base solder layer 34m' (Sn-base solder layer fusing annealing process). This process allows the Sn-base solder layer 34s' to selectively fuse. When the Sn-base solder layer 34s'' under fusion (where ('') expresses that the constituent is under fusing annealing) is allowed to re-solidify as shown in step 10, the process comes to the end. In this embodiment, the fusing annealing of the Sn-base solder layer is carried out in a dedicated atmospheric annealing furnace F, whereas for the case where the Sn-base solder layer 34s' and the Au—Sn-base solder layer 34m' are formed by vacuum evaporation, heating for the fusing annealing of the Sn-base solder layer can be also done by using heat radiation from a heat source of vacuum evaporation in a vacuum evaporation apparatus.

According to the above-described method, formation of the alloyed contact layer 31 having a relatively high melting point precedes (alloying annealing), and formation of the Sn-base solder layer 34s' and the Au—Sn-base solder layer 34m' succeeds. Because the Sn-base solder layer 34s' has the melting point lower than any of those of the alloyed contact layer 31 and the Au—Sn-base solder layer 34m', annealing can be carried out so as to selectively fuse the Sn-base solder layer 34s'. By going through the processes of fusion and re-solidification of the Sn-base solder layer 34s', the Sn-base solder layer 34s and the Au—Sn-base solder layer 34m can tightly be adhered after solidification. The Sn-base solder layer 34s' and the Au—Sn-base solder layer 34m' differ, of course, in the Au and Sn contents from each other, so that both components can diffuse between the layers during the fusing annealing, and again contributes to improve the adhesion strength.

In the Sn-base solder layer fusing annealing step (FIG. 5: step 9), it is allowable to adopt a process such that the Au concentration in the fused Sn-base solder layer 34s'' is raised making use of Au diffused from the Au—Sn-base solder layer 34m'' or the alloyed contact layer 31 so as to elevate the liquidus temperature, and that the Sn-base solder layer 34s'' is re-solidified in the Sn-base solder layer fusing annealing step. The fused Sn-base solder layer 34s'' is likely to accept the Au component flowing thereinto by diffusion, from the solid state Au—Sn-base solder layer 34m'' in contact therewith. In this case, if the amount of diffusion of the Au component into the fused Sn-base solder layer 34s'' becomes unlimitedly large, the Sn-base solder layer 34s after solidification will have an excessively high concentration of Au and will thereby degrade the ductility, supposedly resulting in insufficient effect of preventing the delamination. However, so far as the temperature of fusing annealing of the Sn-base solder layer is kept lower than the melting point of the Au—Sn-base solder layer 34m', as is obvious from the geometry of the liquidus of the Sn-side composition in the Au—Sn-base binary phase diagram shown in FIG. 6, the liquidus (melting) temperature of the Sn-base solder layer 34s'' elevates if the Au concentration in the fused Sn-base solder layer 34s'' is raised up to a certain Au concentration or above, and the Sn-base solder layer 34s'' once fused can re-solidify. As a consequence, the process thereafter proceeds as solid diffusion of Au into the Sn-base solder layer 34s'' (after re-solidified) only at a low diffusion speed, so that any non-conformities causing excessive Au concentration of the final Sn-base solder layer 34s are effectively avoidable, unless otherwise the annealing time is prolonged.

In FIG. 1, the Sn content of the resultant Sn-base solder layer 34s is preferably adjusted to 75% by mass or more (100% by mass also included). The Sn content of less than 75% by mass degrades the ductility of the Sn-base solder layer 34s, and makes the effect of preventing delamination of the Au—Sn-base solder layer 34m insufficient. The residual components excluding the Sn component in the Sn-base solder layer 34s will consequently be occupied by Au in the major portion thereof, considering that the Sn-base solder layer 34s' goes through the fusing annealing while being kept in contact with the Au—Sn-base solder layer 34m', as shown in step 9 in FIG. 5 (more specifically, 80% by mass or more of the residual portion of the Sn-base solder layer 34s excluding the Sn component accounts for Au). In this case, as shown in FIG. 1, the Sn content in the Sn-base solder layer 34s less than 75% by mass results in increase in the content of Au as the residual component, increase in the amount of production of Au—Sn-base compounds ($AuSn_4$, $AuSn_2$ and AuSn) poor in ductility, and particularly large tendency of degrading the ductility of the Sn-base solder layer 34s.

In view of minimizing the amount of production of the AuSn compounds, and of enhancing the effect of preventing delamination of the Au—Sn-base solder layer 34m through improvement in the ductility of the Sn-base solder layer 34s after the annealing, it is preferable to use the Sn-base solder layer 34s' having a composition, before the fusing annealing, maximized in the Sn content as possible, and in view of suppressing the melting point thereof so as not to exceed 232° C. for example, that is a melting point of Sn, the Sn content (before fusing annealing) in the Sn-base solder layer 34s' is preferably set to 85% by mass or more and 100% by mass or less (the composition achieved after the fusing annealing is appropriately set to 85% by mass or more and 93% by mass or less, considering the Au diffusion).

Figure 7:
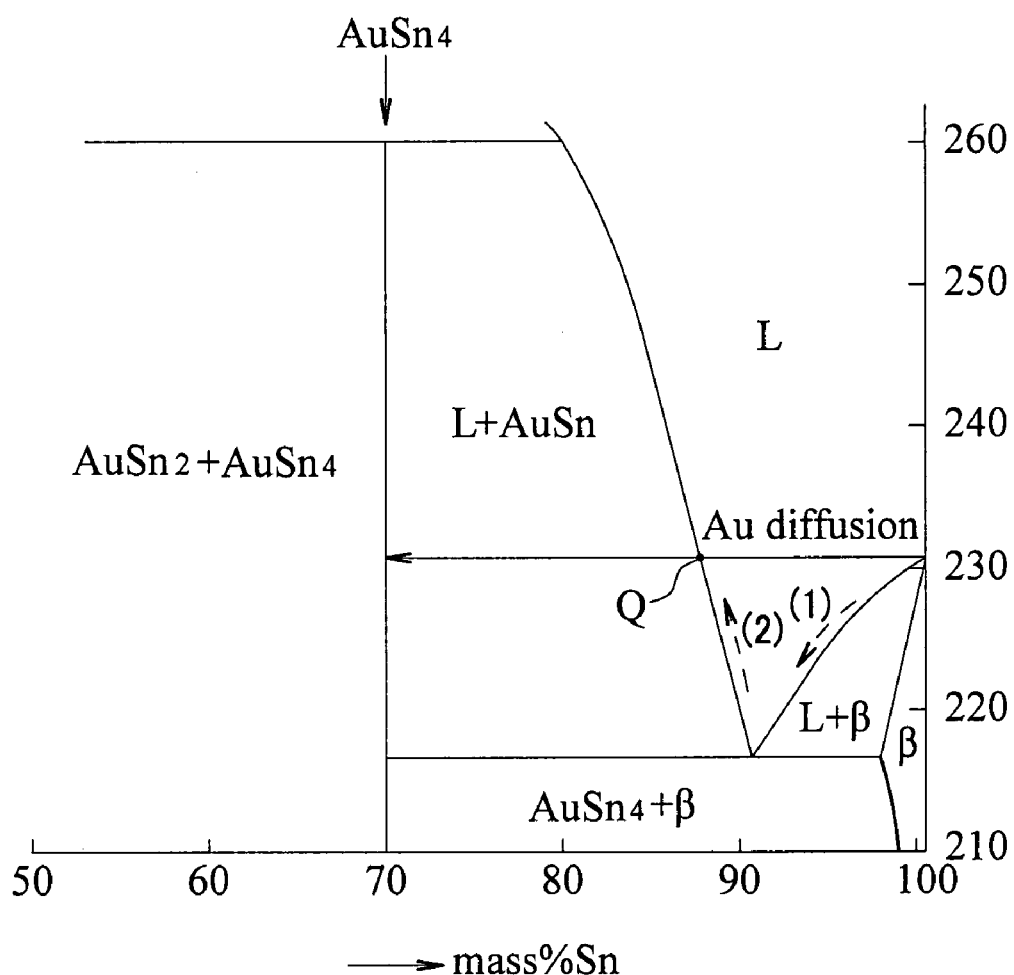
FIG. 7 is a phase diagram showing an enlarged view of the Sn side of FIG. 6.

As shown in FIG. 7 (see FIG. 5 for the reference numerals), when the Sn-base solder layer 34', which is richer in Sn than the eutectic composition (10% by mass of Au), is allowed to fuse, the composition thereof shifts towards the eutectic side by contribution of Au diffused from the Au—Sn-base solder layer 34m'', and the melting point (liquidus temperature) once drops. When the Au concentration in the Sn-base solder layer 34s'' under fusion exceeds the eutectic composition, the melting point again starts to increase. The Au concentration in the liquid phase then increases along the liquidus in the binary phase diagram up to the Au composition corresponded to the fusing annealing temperature, allowing thereafter $AuSn_4$ to deposit while keeping the Au concentration in the liquid phase at a constant level. The deposition reaction proceeds relatively slowly, because the reaction is accompanied by migration of the Au component against the Au concentration gradient from the liquid phase side having lower Au concentrations to the $AuSn_4$ solid phase side having higher Au concentrations, so that it is preferable to terminate the fusing annealing and to allow the solder layer to cool, before the amount of deposition of $AuSn_4$ becomes excessive (that is, before the Sn content in the Sn-base solder layer 34s after the fusing annealing falls below 75% by mass).

When the Sn-base solder layer 34s', which is richer in Sn than the eutectic composition, is adopted, the initial temperature allowing the Sn-base solder layer 34s' to fuse must be raised at or above the eutectic temperature, wherein under the fusing annealing temperature kept at a constant level, when Au starts to diffuse from the Au—Sn-base solder layer 34m'', the Au concentration in the Sn-base solder layer 34s'' inevitably increases up to a composition (point Q in the drawing) corresponded to the liquid on the Au-rich side of the eutectic composition, and this consequently results in increase in the amount of $AuSn_4$ in the solidified Sn-base solder layer 34s. However, by using the solder layer composed of SnAu alloy having a composition around the eutectic composition (for example, Au: 7% by mass or more and 13% by mass or less), and by setting the fusing annealing temperature at a temperature straight above the eutectic point (for example, 217° C. or above and 225° C. or below), the amount of production of $AuSn_4$ can be suppressed to a level correspondent to the eutectic composition or around, and the Sn-base solder layer 34s having a more excellent ductility (in other words, more effective in preventing delamination) can be obtained.

Next, as shown in FIG. 1, the Au—Sn-base solder layer 34m is adjusted in the composition thereof, so as to contain 30% by mass or more and 90% by mass or less of Au, and 10% by mass or more and 70% by mass or less of Sn, so as to have the total content of Au and Sn of 80% by mass or more, and so as to have the melting point higher than that of the Sn-base solder layer 34s. The Au content of less than 30% by mass (or the Sn content exceeding 70% by mass) will make corrosion resistance of the solder layer insufficient, and the Au content exceeding 90% by mass (or the Sn content less than 10% by mass) will make the melting point of the solder layer excessively high, and the reflow temperature for mounting the device chip becomes excessively high. For the purpose of lowering the melting point of the solder, other by-components (Zn, Ge, Bi, Te, Si and Sb, for example) may be added up to an amount of 20% by mass of the total solder composition. The total content of Au and Sn is, therefore, adjusted to 80% by mass or more (100% by mass or less). The Au—Sn-base solder layer 34m causes only slight changes in the composition thereof before and after the fusing annealing, so far as the thickness thereof is set sufficiently larger than that of the Sn-base solder layer 34s, as described later.

If the reflow process of the Au—Sn-base solder layer 34m, aimed at mounting the light emitting device chip onto the conductive support 52, is carried out at a temperature allowing complete fusion of the Au—Sn-base solder layer 34m and the Sn-base solder layer 34s, the Sn-base solder layer 34s capable of functioning as a buffer layer would disappear, and could no more exhibit the effect of preventing delamination of the Au—Sn-base solder layer 34m. In this case, it is necessary to assume an average solder composition possibly achieved when the entire portion of the Au—Sn-base solder layer 34m and the entire portion of the Sn-base solder layer 34s are completely fused with each other, and to adopt a reflow temperature lower than the melting point of such virtual average solder composition. For an exemplary case of Au—Sn binary system, as is obvious from the phase diagram in FIG. 6, the reflow process must be proceeded at a temperature lower than the congruent temperature (418° C.) of the AuSn compound.

Figure 6:
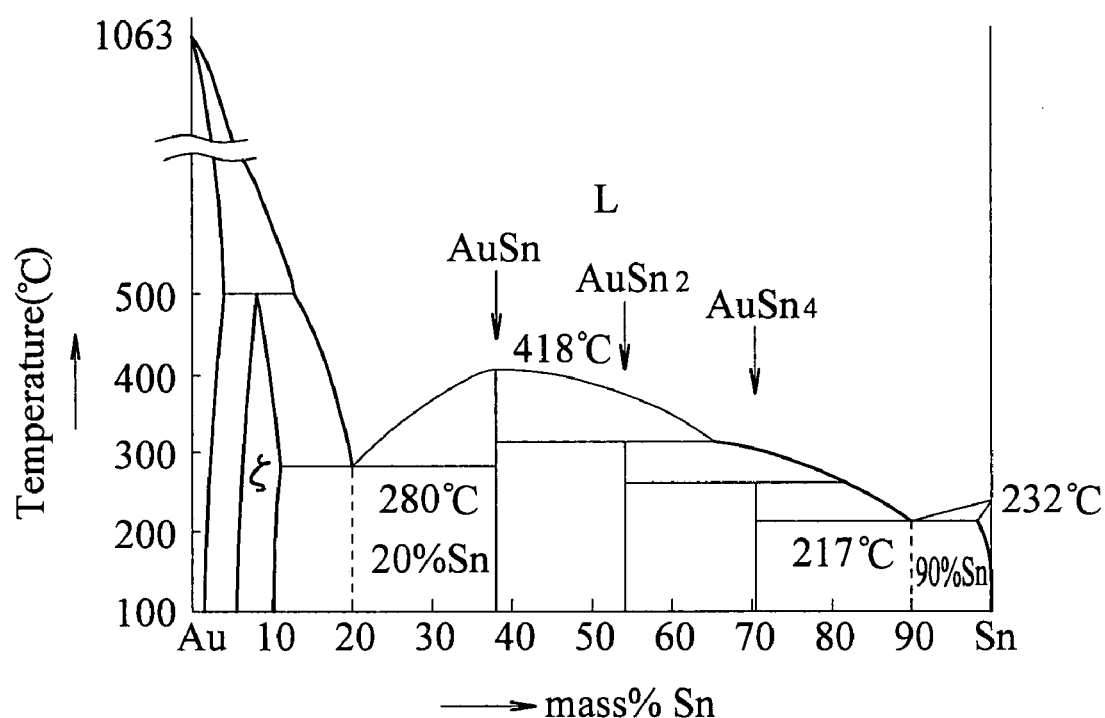
FIG. 6 is an Au—Sn-base binary phase diagram.

As shown in FIG. 6, at the congruent temperature of AuSn compound, the liquidus on the Sn-rich side and the liquidus on the Au-rich side connect with each other while forming the critical temperature in between. Therefore, in the temperature region lower than the congruent temperature, the Sn-rich liquid phase and the Au-rich liquid phase coexist while being separated. As a consequence, if the Au—Sn-base solder layer 34m is configured based on a Au-rich composition as compared with the AuSn compound (38% by mass Sn), the liquid phase on the Au—Sn-base solder layer 34m side and the liquid phase on the Sn-base solder layer 34s side are prevented from mixing with each other during the reflow process, the Sn content on the Sn-base solder layer 34s side can be kept at a high level even after the reflow, raising an advantage that the function of Sn-base solder layer 34s as a buffer layer is less likely to degrade. From this point of view, by adopting a composition of the Au—Sn-base solder layer 34m, such as mainly containing Au (60% by mass or more) and containing Sn to as much as 15% by mass or more and 35% by mass or less, the reflow is allowed to proceed at a relatively low temperature of 400° C. or below, and also compositional mixing with the Sn-base solder layer 34s can effectively be suppressed. Because the Au-rich-side phase (intermediate phase ζ or metastable Au—Sn solid solution) and the AuSn compound form an eutectic in this compositional region, a distinct effect of lowering the reflow temperature can be achieved by adopting the Sn content particularly at around the eutectic composition (20% by mass Sn) (Sn: 17% by mass or more and 23% by mass or less, for example).

In view of improving the corrosion resistance of the solder layer as a whole, the Au—Sn-base solder layer 34m is preferably formed to a thickness larger than that of the Sn-base solder layer 34s poorer in corrosion resistance. In particular, for the case where the light emitting device chip is covered with the epoxy resin mold 50m as described in the above, adoption of this configuration raises a distinctive effect. In this case, the thickness of the Au—Sn-base solder layer 34m is preferably adjusted 5 times to 20 times, both ends inclusive, as large as the thickness of the Sn-base solder layer 34s. The thickness of the Au—Sn-base solder layer 34m less than 5 times as large as the thickness of the Sn-base solder layer 34s excessively increases the relative thickness of the Sn-base solder layer 34s, and may result in only an insufficient effect of improving the corrosion resistance of the solder layer as a whole. On the other hand, if the thickness of the Au—Sn-base solder layer 34m exceeds a 20-fold thickness of the Sn-base solder layer 34s, the relative thickness of the Sn-base solder layer 34s becomes excessively small, so that the Sn-base solder layer 34s may function only insufficiently as a mechanical buffer layer, and may become more likely to cause problems in delamination and the like. The thickness of the Sn-base solder layer 34s is preferably adjusted to 100 nm or more and 1 µm or less (200 nm in this embodiment), and the thickness of the Au—Sn-base solder layer 34m is preferably adjusted to 500 nm or more and 10 µm or less (3 µm in this embodiment).

Next, the second electrodes 16 can be formed, as shown in FIG. 1, as being distributed on the compound semiconductor layer 100 on the second main surface side of the light emitting layer section 24. The region of the alloyed contact layer 31 of the second electrode 16 has a small reflectivity, and shows only a small effect of reflecting the direct flux of beam coming from the light emitting layer section 24 back to the first main surface side (or chip flank side). However, by forming the second electrodes 16 in a distributed manner, the region of the compound semiconductor layer 100, having no second electrodes 16 formed thereon on the second main surface side, can be used as a reflective region (in this embodiment, the emission flux of beam is reflected by the reflective metal layer 52g, as shown in FIG. 2), so that an effect of improving the light extraction efficiency by allowing the direct flux of beam to reflect towards the first main surface side can be expected. This effect becomes distinctive particularly for the case where the transparent compound semiconductor layer 70 composed of a compound semiconductor transparent to the flux of beam emitted from the light emitting layer section 24 is provided as shown in this embodiment, and the second electrodes 16 are formed as being distributed on the second main surface of the transparent compound semiconductor layer 70.

In the configuration shown in FIG. 1, the second electrodes 16 are formed on the second main surface of the compound semiconductor layer 100, as being distributed after being patterned into a predetermined geometry, and in each of the second electrodes 16, the solder layer is formed so as to align position of the circumferential side faces thereof with those of the alloyed contact layer 31. According to this configuration, the area of the fused solder layer possibly swelling out of the alloyed contact layer 31 during the reflow process can be minimized, and thereby larger area available as the reflective surface can be ensured between respective adjacent second electrodes 16. By adopting the method of fabrication of this invention, a structure of this sort of second electrodes 16 can be obtained in an extremely easy manner as described below.

Figure 4:
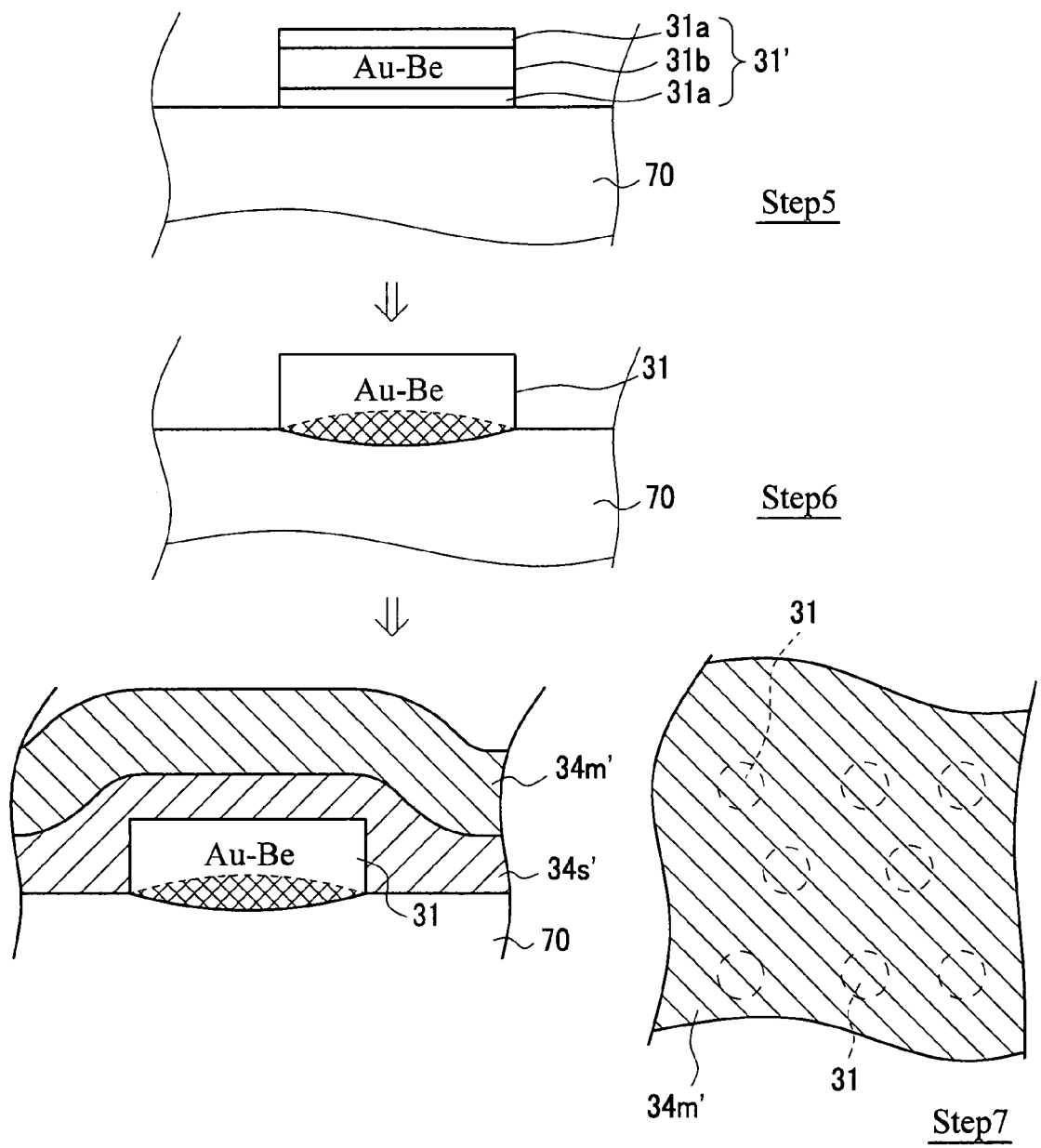
FIG. 4 is a second explanatory drawing of the same.

That is, as shown in step 7 in FIG. 4, the alloyed contact layer 31 is formed as being distributed on the second main surface of the compound semiconductor layer 100, and the Sn-base solder layer 34s' is formed so as to cover the alloyed contact layer 31 and the exposed area of the background compound semiconductor layer 100 (transparent compound semiconductor layer 70) in an integrated manner. The Au—Sn-base solder layer 34m' is further formed. Thereafter, the Sn-base solder layer fusing annealing step is carried out, as shown in steps 9 and 10 in FIG. 5.

Figure 8:
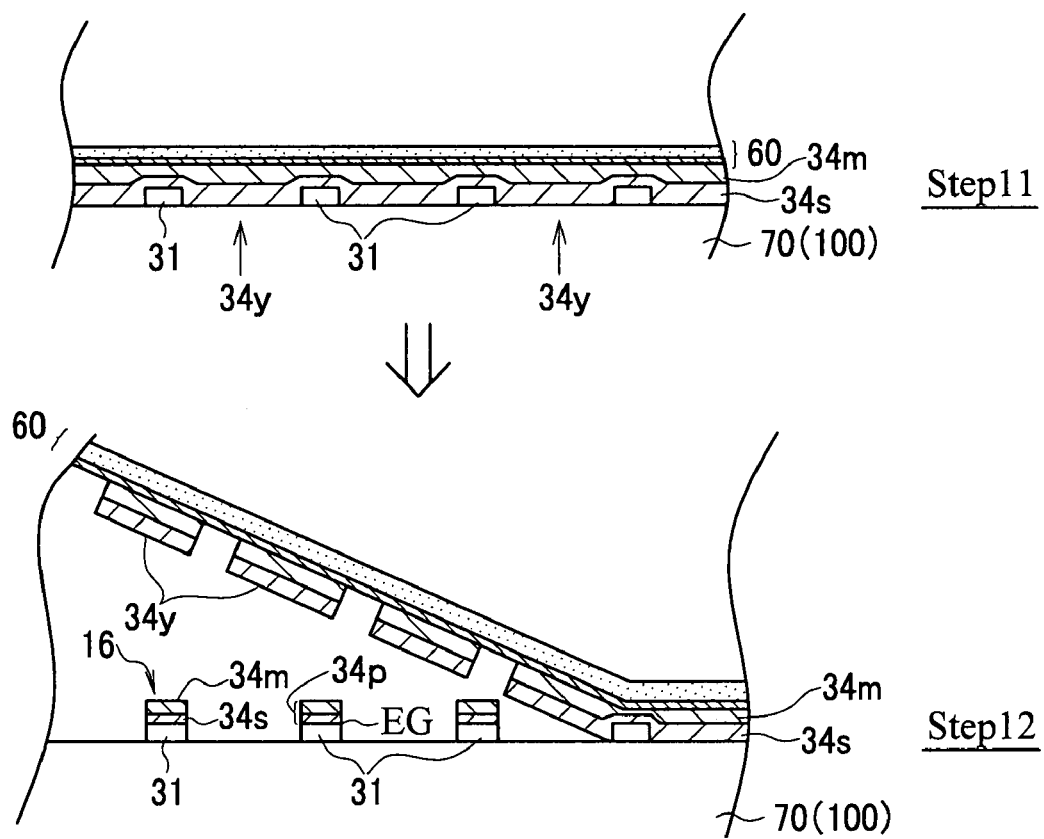
FIG. 8 is a drawing explaining the lift-off process.
Figure 9:
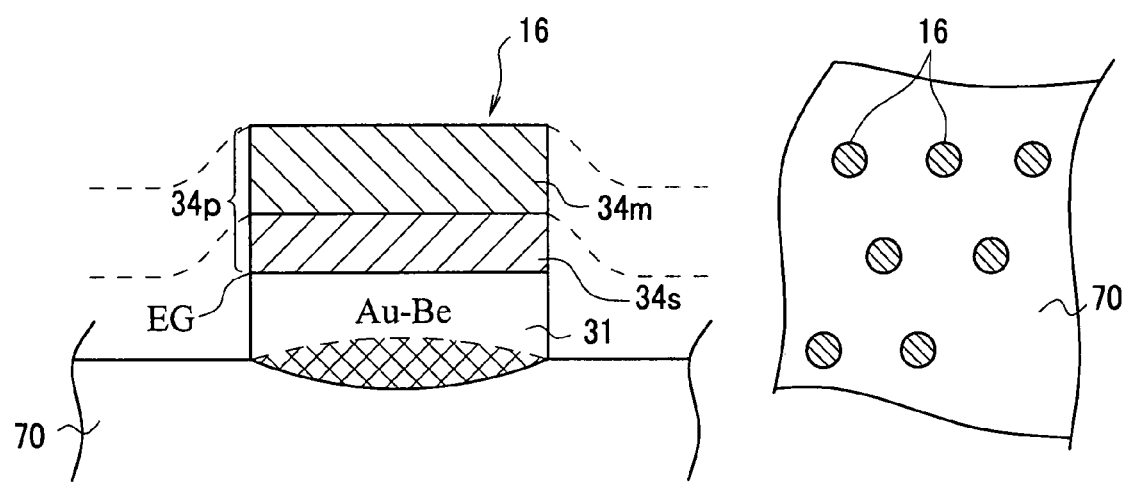
FIG. 9 is a schematic sectional view of the second electrodes after the lift-off process.

Next, as shown in step 11 and step 12 in FIG. 8, the lift-off process is carried out so as to remove the stacked film of the Sn-base solder layer 34s and the Au—Sn-base solder layer 34m, selectively in the portion 34y thereof covering the background of the alloyed contact layer 31, while leaving the portion thereof covering the alloyed contact layer 31 as being closely adhered to the alloyed contact layer 31. In the Sn-base solder layer fusing annealing step, the adhesive force of the Sn-base solder layer 34s with the compound semiconductor layer 100, specifically in the portion thereof in direct contact with the exposed region of the compound semiconductor layer 100, is far smaller than the adhesive force thereof with an underlying metal, specifically in the portion having the alloyed contact layer 31 formed therein, so that the portion covering the background of the alloyed contact layer 31 can extremely readily be lifted off, typically by adhering and peeling of an adhesive sheet 60. Structure of the resultant solder layer is, as shown in FIG. 9, such as having the circumferential side faces 34p thereof formed as mechanically fractured surfaces extending in the thickness-wise direction as being originated from the outer circumference EG of the bonding interface with the alloyed contact layer 31.

Figure 13:
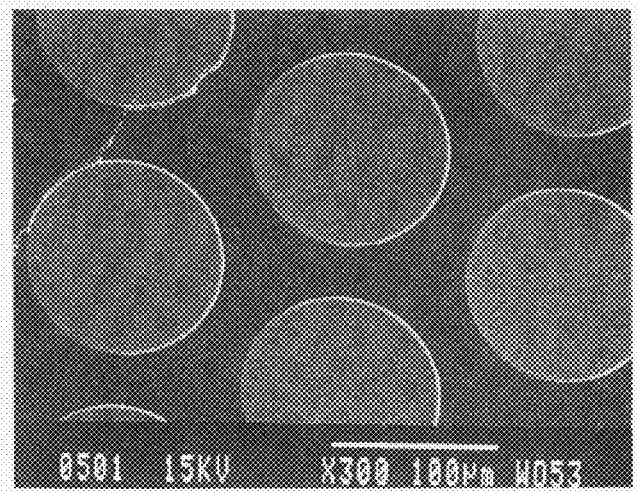
FIG. 13 is a first image showing a result of a test confirming the effects of this invention.
Figure 14:
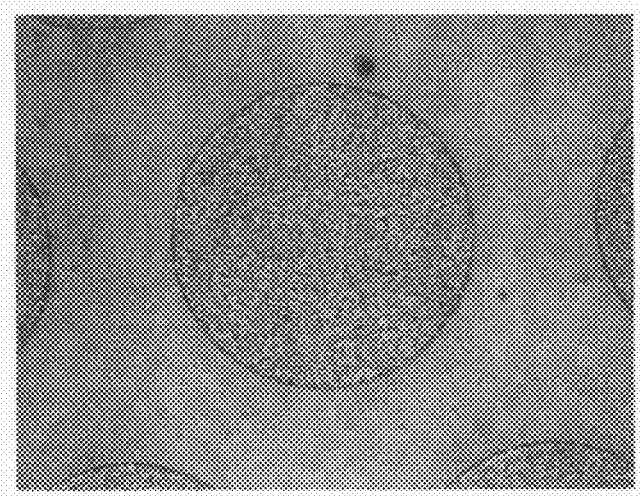
FIG. 14 is a second image of the same.
Figure 15:
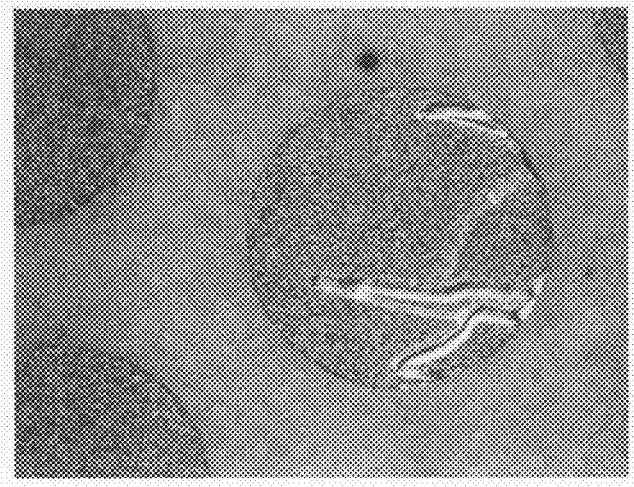
FIG. 15 is a third image of the same.

FIG. 13 to FIG. 15 are enlarged images showing results of experiments conducted in order to confirm the above-described effects. FIG. 13 is an enlarged image showing the second main surface side on which the solder layer 34 was formed and then applied to the fusing annealing, wherein the circular areas arranged in a staggered manner are the areas destined for formation of the second electrodes 16, and the background thereof is covered with the solder layer 34. In the background region between the half-moon-like second electrode on the upper left and the second electrode straight thereunder, the crack (appears as a white line in the image) occurs in the solder layer 34 so as to connect both electrode areas. This indicates that the adhesive force of the solder layer 34 is low in the background region, and the solder layer 34 lifts up. FIG. 14 shows a state after the lift-off process, wherein the solder layer is broken along the circular boundary with the second electrode, the solder layer in the background region is almost completely removed off by the lift-off process, showing absolutely no influence of the delamination exerted on the solder layer on the second electrode. FIG. 15 shows the surface of the second electrode after the lift-off process, as being scratched with a tip of a metal pin. It was confirmed that delamination of the solder layer was not found even challenged by scratching, and that the solder layer and the alloyed contact layer were kept tightly adhered with each other.

Figure 11:
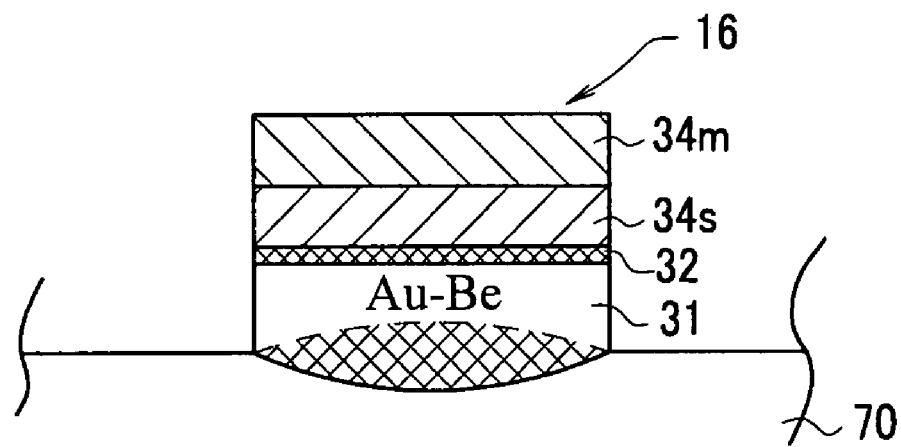
FIG. 11 is a schematic sectional view showing a first example of a structure of the second electrodes for the case where the barrier metal layer is provided.
Figure 12:
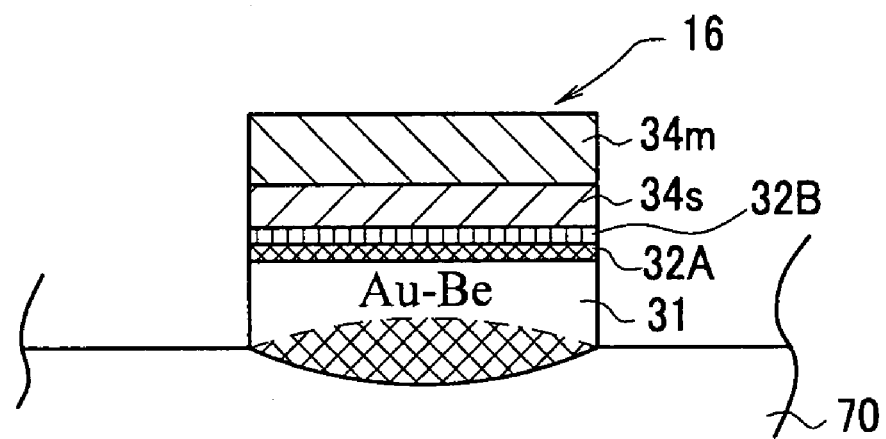
FIG. 12 is a schematic sectional view showing a second example of the same.

In the light emitting device 1 of this invention, as shown in FIG. 11, a barrier metal layer 32, suppressing diffusion of the alloy components between the alloyed contact layer 31 and the solder layer, may be disposed between the alloyed contact layer 31 and the solder layer in the second electrodes 16. By this configuration, any nonconformities such that the alloyed contact layer 31 or the solder layer is modified due to the compositional diffusion, typically in the reflow process of the solder layer, can effectively be suppressed. In particular, it is anticipated that a large amount of Sn diffused from the solder layer side to the alloyed contact layer 31 side may adversely affect the ohmic contact characteristics between the alloyed contact layer 31 and the compound semiconductor layer 100, so that, from this point of view, it is preferable to compose the barrier metal layer 32 as containing one or more layers having any one of Ti, Pt and Mo as the major component (50% by mass or more). In the configuration shown in FIG. 11, the barrier metal layer 32 is composed of Ti. FIG. 12 shows another case having double-layered barrier metal layers 32A, 32B, wherein the Ti layer 32A is formed on the alloyed contact layer 31 side, and the Pt layer 32B is formed on the Sn-base solder layer 34s side. The barrier metal layer may be configured by three or a still larger number of layers.

Figure 10:
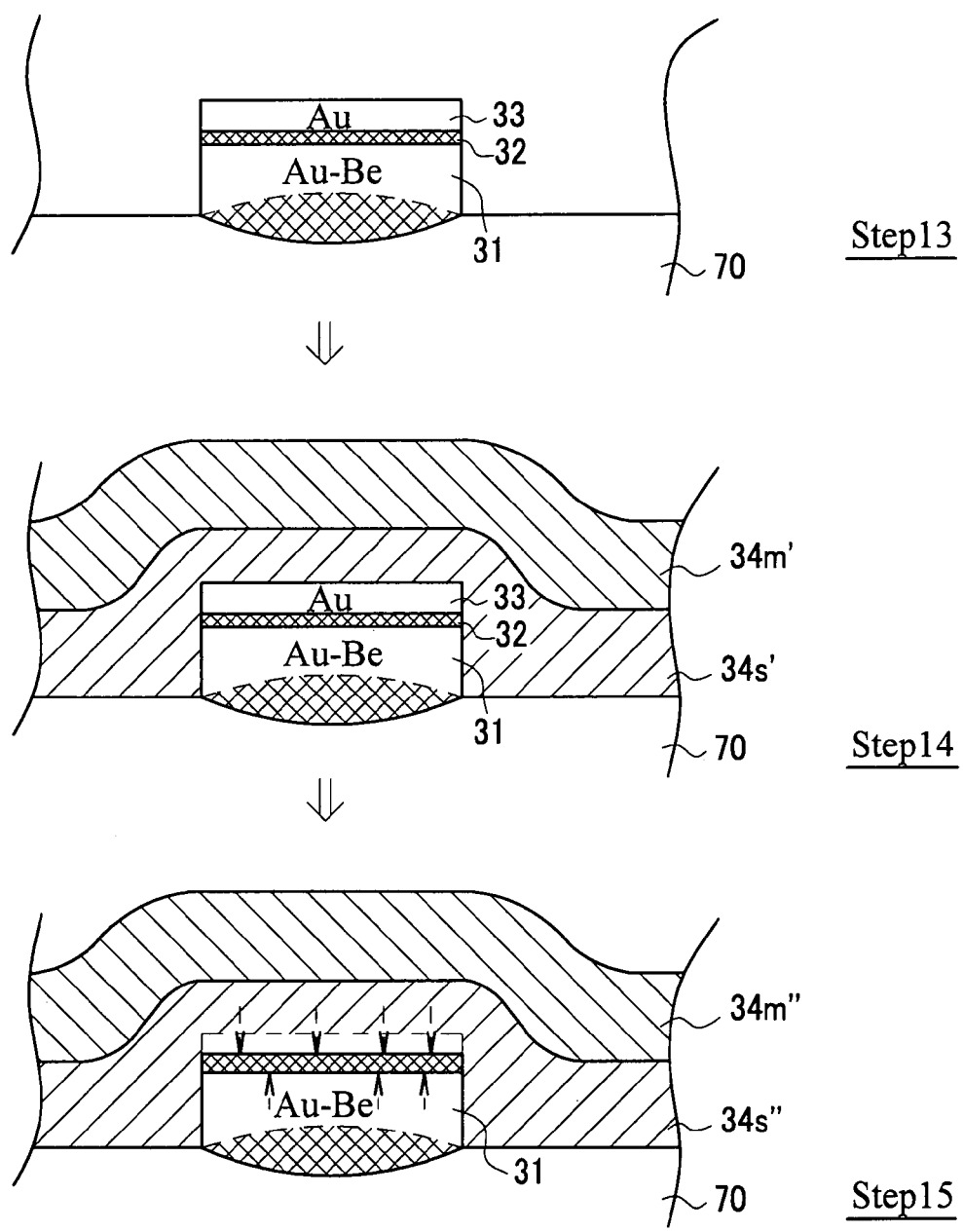
FIG. 10 is a drawing explaining process steps for the case where the barrier metal layer is provided.

For the case where the barrier metal layer 32 is provided, the method of fabrication of this invention can be proceeded as described below. That is, as shown in step 13 in FIG. 10, the barrier metal layer 32 aimed at suppressing diffusion of the alloy components between the alloyed contact layer 31 and the solder layer is formed on the alloyed contact layer 31. An Au-base auxiliary metal layer 33 having Au as a major component (50% by mass or more) is then formed on the barrier metal layer 32 (the Au-base auxiliary metal layer 33 is a Au layer in this embodiment). Next, as shown in step 14, the Sn-base solder layer 34s and the Au—Sn-base solder layer 34m are formed on the Au-based auxiliary metal layer 33, and then as shown in step 15, the Sn-base solder layer fusing annealing step is carried out. By preliminarily forming the Au-base auxiliary metal layer 33 on the barrier metal layer 32, the adhesive force between the Sn-base solder layer 34s and the barrier metal layer 32 can be enhanced. In the process of the Sn-base solder layer fusing annealing step in this case, the Au-base auxiliary metal layer 33 can be dissolved into the Sn-base solder layer 34s". As a consequence, the step of re-solidifying the Sn-base solder layer 34s will more readily be carried out, by virtue of an elevated melting point caused by the Au dissolution.

What is claimed is:

1. A light emitting device comprising a compound semiconductor layer having therein a light emitting layer section, said compound semiconductor layer being assumed that the main surface thereof positioned on the light extraction side is referred to as a first main surface, and that the main surface thereof opposite thereto as a second main surface, having a first electrode formed on said first main surface of said compound semiconductor layer, having second electrodes formed on said second main surface, so as to be used as being electrically connected through said second electrodes to a conductive support for the device to be fixed to, wherein each of said second electrodes comprises an alloyed contact layer disposed in contact with the second main surface of said compound semiconductor layer, aimed at reducing contact resistance with said compound semiconductor layer, and a solder layer connecting said alloyed contact layer to said conductive support, said solder layer having formed therein a Sn-base solder layer disposed on said alloyed contact layer side and composed of a Sn-base metal mainly containing Sn and having a melting point lower than that of said alloyed contact layer, and a Au—Sn-base solder layer disposed in contact with said Sn-base solder layer on the opposite side of said alloyed contact layer, containing 30% by mass or more and 90% by mass or less of Au, and 10% by mass or more and 70% by mass or less of Sn, the total content of Au and Sn being 80% by mass or more, and having the melting point higher than that of said Sn-base solder layer, and the Sn content of said Sn-base solder layer is 75% by mass or more.

2. The light emitting device as claimed in claim 1, wherein said Au—Sn-base solder layer is mainly composed of Au, and having a Sn content of 15% by mass or more and 35% by mass or less.

3. The light emitting device as claimed in claim 1, wherein said Au—Sn-base solder layer is formed with a thickness larger than that of said Sn-base solder layer.

4. The light emitting device as claimed in claim 1, wherein said second electrodes are formed as being distributed on the second main surface of said compound semiconductor layer.

5. The light emitting device as claimed in claim 4, wherein, on said second main surface of said compound semiconductor layer, the second electrodes are formed as being distributed after being patterned into a predetermined geometry, and said solder layer in each of said second electrodes is formed so as to align position of the circumferential side faces thereof with that of said alloyed contact layer.

6. The light emitting device as claimed in claim 5, wherein the circumferential side faces of said solder layer are formed as mechanically fractured surfaces extending in the thickness-wise direction as being originated from the outer circumference of the bonding interface with said alloyed contact layer.

7. The light emitting device as claimed in claim 1, wherein said second electrode further comprises a barrier metal layer suppressing diffusion of the alloying components between said alloyed contact layer and said solder layer, as being disposed between said alloyed contact layer and said solder layer.

8. The light emitting device as claimed in claim 7, wherein said barrier metal layer is composed of one or more layers containing any one of Ti, Pt and Mo as the major component.

9. A light emitting device module comprising the light emitting device described in claim 1, a conductive support on which said compound semiconductor layer of said light emitting device is bonded through said solder layer of said second electrodes, and an epoxy resin mold covering said light emitting device on said conductive support.

10. A method of fabricating the light emitting device described in claim 1, comprising:
a source metal layer forming step of forming a source metal layer of said alloyed contact layer on the second main surface of said compound semiconductor layer;
an alloying annealing step of alloying said source metal layer with said compound semiconductor layer to produce said alloyed contact layer;
a Sn-base solder layer forming step of forming said Sn-base solder layer on said alloyed contact layer;
a Au—Sn-base solder layer forming step of forming said Au—Sn-base solder layer on said Sn-base solder layer; and
a Sn-base solder layer fusing annealing step of heating the electrode stack structure having said alloyed contact layer, said Sn-base solder layer and said Au—Sn-base solder layer stacked therein in this order, at a temperature not lower than the melting point of said Sn-base solder layer, and lower than the melting points of said alloyed contact layer and said Au—Sn-base solder layer, so as to selectively fuse said Sn-base solder layer, as being carried out in this order.

11. The method of fabricating the light emitting device as claimed in claim 10, wherein in said Sn-base solder layer fusing annealing step, the Au concentration in the fused Sn-base solder layer is raised making use of Au diffused from said Au—Sn-base solder layer or said alloyed contact layer so as to elevate the liquidus temperature, and said Sn-base solder layer is re-solidified in said Sn-base solder layer fusing annealing step.

12. The method of fabricating the light emitting device as claimed in claim 11, wherein said alloyed contact layer is formed as being distributed on the second main surface of said compound semiconductor layer, and said Sn-base solder layer is formed so as to cover said alloyed contact layer and the exposed area of the compound semiconductor layer as background in an integrated manner, said Au—Sn-base solder layer is further formed, said Sn-base solder layer fusing annealing step is carried out, and thereafter a lift-off process is carried out so as to remove the stacked film of said Sn-base solder layer and said Au—Sn-base solder layer, selectively in the portion thereof covering the background of said alloyed contact layer, while leaving the portion thereof covering said alloyed contact layer as being closely adhered to said alloyed contact layer.

13. The method of fabricating the light emitting device as claimed in claim 10, wherein said alloyed contact layer is formed as being distributed on the second main surface of said compound semiconductor layer, and said Sn-base solder layer is formed so as to cover said alloyed contact layer and the exposed area of the compound semiconductor layer as background in an integrated manner, said Au—Sn-base solder layer is further formed, said Sn-base solder layer fusing annealing step is carried out, and thereafter a lift-off process is carried out so as to remove the stacked film of said Sn-base solder layer and said Au—Sn-base solder layer, selectively in the portion thereof covering the background of said alloyed contact layer, while leaving the portion thereof covering said alloyed contact layer as being closely adhered to said alloyed contact layer.

* * * * *